US011114155B2

(12) United States Patent
Arsovski et al.

(10) Patent No.: US 11,114,155 B2
(45) Date of Patent: Sep. 7, 2021

(54) HIGH-DENSITY HIGH-BANDWIDTH STATIC RANDOM ACCESS MEMORY (SRAM) WITH PHASE SHIFTED SEQUENTIAL READ

(71) Applicant: MARVELL INTERNATIONAL LTD., Hamilton (BM)

(72) Inventors: Igor Arsovski, Williston, VT (US); Akhilesh Patil, South Burlington, VT (US); Eric D. Hunt-Schroeder, Essex Junction, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/256,584

(22) Filed: Jan. 24, 2019

(65) Prior Publication Data

US 2020/0243130 A1 Jul. 30, 2020

(51) Int. Cl.
*G11C 7/10* (2006.01)
*G11C 11/419* (2006.01)
*G11C 11/418* (2006.01)
*G11C 7/08* (2006.01)
*G11C 7/22* (2006.01)
*G11C 7/12* (2006.01)

(52) U.S. Cl.
CPC ............ *G11C 11/419* (2013.01); *G11C 7/08* (2013.01); *G11C 7/106* (2013.01); *G11C 7/1057* (2013.01); *G11C 7/1063* (2013.01); *G11C 7/1069* (2013.01); *G11C 7/12* (2013.01); *G11C 7/222* (2013.01); *G11C 11/418* (2013.01)

(58) Field of Classification Search
CPC ....... G11C 11/419; G11C 11/418; G11C 7/08; G11C 7/1063; G11C 7/222; G11C 7/106; G11C 7/1057; G11C 7/12; G11C 7/1069; G11C 7/1018; G11C 7/1042
See application file for complete search history.

(56) References Cited

U.S. PATENT DOCUMENTS

| 6,108,243 | A  | * | 8/2000 | Suzuki ................. | G11C 7/1018 |
| | | | | | 365/189.14 |
| 9,613,685 | B1 | * | 4/2017 | Seetharaman ........ | G11C 11/419 |
| 2002/0136069 | A1 | | 9/2002 | Reggiori et al. | |
| 2003/0167374 | A1 | | 9/2003 | Hronik | |
| 2007/0147160 | A1 | * | 6/2007 | Hanzawa ............. | G11C 29/028 |
| | | | | | 365/230.03 |
| 2008/0123451 | A1 | * | 5/2008 | Rao ....................... | G11C 11/405 |
| | | | | | 365/203 |
| 2016/0163379 | A1 | | 6/2016 | Roine et al. | |

OTHER PUBLICATIONS

Unknown, "Understanding Burst Modes in Single Data Rate Synchronous SRAMs", Cypress Perform; Doc. No. 001-22619, REV. *A, Cypress Semiconductor, San Jose, CA, Aug. 10, 2011, 4 pages.

* cited by examiner

*Primary Examiner* — Mohammed A Bashar

(57) ABSTRACT

The present disclosure relates to a structure including a read controller configured to receive a burst enable signal and a word line pulse signal, identify consecutive read operations from storage cells accessed via a word line, precharge bit lines once during consecutive, sequential reads, and hold the word line active through N−1 of the consecutive read operations, and N is an integer number of the consecutive read operations.

20 Claims, 8 Drawing Sheets

HIGH-DENSITY HIGH-BANDWIDTH STATIC RANDOM ACCESS MEMORY (SRAM) WITH PHASE SHIFTED SEQUENTIAL READ

FIELD OF THE INVENTION

The present disclosure relates to a phase shifted sequential read mode in a static random access memory, and more particularly, to a circuit and a method for using a phase shifted burst mode in a static random access memory to save power and improve performance associated with address switching and decoding.

BACKGROUND

Memory devices are employed as internal storage areas in a computer or other electronic equipment. One specific type of memory used to store data in a computer is random access memory (RAM). RAM is typically used as a main memory in a computer environment, and is generally volatile in that once power is turned off all data stored in the RAM is lost.

A static random access memory (SRAM) is one example of a RAM. The SRAM has the advantage of holding data without a need for refreshing. A typical SRAM device includes an array of individual SRAM cells. Each SRAM cell is capable of storing a binary voltage value that represents a logical data bit (e.g., "0" or "1").

In SRAM, energy efficiency is a challenge with a need for lower power. For example, typical machine learning applications require lower power as well as faster memory access. In a typical deep neural network hardware, memory is used to store weight parameters and activations as an input propagates through the network. The typical neural network application uses SRAMs to store weights and activations. These weights are stored in consecutive (i.e., next to one another) memory locations to address spatial locality. Further, a typical deep-learning architecture reads full layer matrix in a linear fashion and uses the data to generate the next layer. Applications that require sequential access rather than full random access can achieve power savings and performance enhancement (higher bandwidth) wherein a signal is developed on multiple adjacent words in parallel (i.e., multiple columns connected to a single sense amplifier) and control circuitry enables sensing these words consecutively in a burst mode.

SUMMARY

In an aspect of the disclosure, a structure includes a read controller configured to receive a burst enable signal and a word line pulse signal, identify consecutive read operations from storage cells accessed via a word line, precharge bit lines once during consecutive, sequential reads, and hold the word line active through N-1 of the consecutive read operations, and N is an integer number of the consecutive read operations.

In another aspect of the disclosure, a circuit includes a plurality of first bitswitches which are connected to corresponding bit lines, a second bitswitch which receives a corresponding bit line and is connected to a tribuffer circuit that outputs a tribuffer output signal to a second latch, and a sense amplifier that receives the outputs of the first bitswitches and outputs a sense output signal to a first latch.

In another aspect of the disclosure, a method includes sensing sequential read operations of N-1 consecutive read operations through a sense amplifier, and sensing a Nth read operation through a skewed tribuffer circuit to enable early bit line restore and activation of a next word line in a cycle earlier than a next cycle, and N is an integer number of the consecutive read operations.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a phase shifted sequential read mode in a static random access memory, and more particularly, to a circuit and a method for using a phase shifted burst mode in a static random access memory to save power and improve performance associated with address switching and decoding. More specifically, the present disclosure uses phase shifted burst arrays to address sense amplifier restore bubbles with interleaved banks. Advantageously, the present disclosure improves bandwidth and performance of SRAM read operations.

In conventional technology, a burst mode architecture can improve both power and bandwidth in multiplexer-wide burst operations for memory. However, in the conventional technology, at the end of the burst operations, a precharge time is required to precharge the bit lines back up and activate another word line before the next read operation. This precharge time creates a bubble in the operation stream. The precharge time bubble occurs when there is a transition from one group of sequential reads (e.g., 4 columns) to the next group of columns (i.e., a new word line activation). The precharge time bubble causes an issue since the signal development time (i.e., the precharge time) is large for the first slow read operation in the next group of columns. For example, a sense amplifier in a first bank (i.e., BANK0) may be busy precharging the data lines so it is not possible to turn on the bitswitch for the next column. Precharging the data lines is required to clear the read data from the last sense operation.

The present disclosure uses a phase-shift operation which reads from different banks to hide the bitline restore dead time that occurs in the conventional technology due to the bubble (i.e., the bitline precharge time bubble) when transitioning from one group of sequential reads to the next group of columns. Therefore, the present disclosure increases bandwidth and performance without increasing power requirements.

Figure 1A:
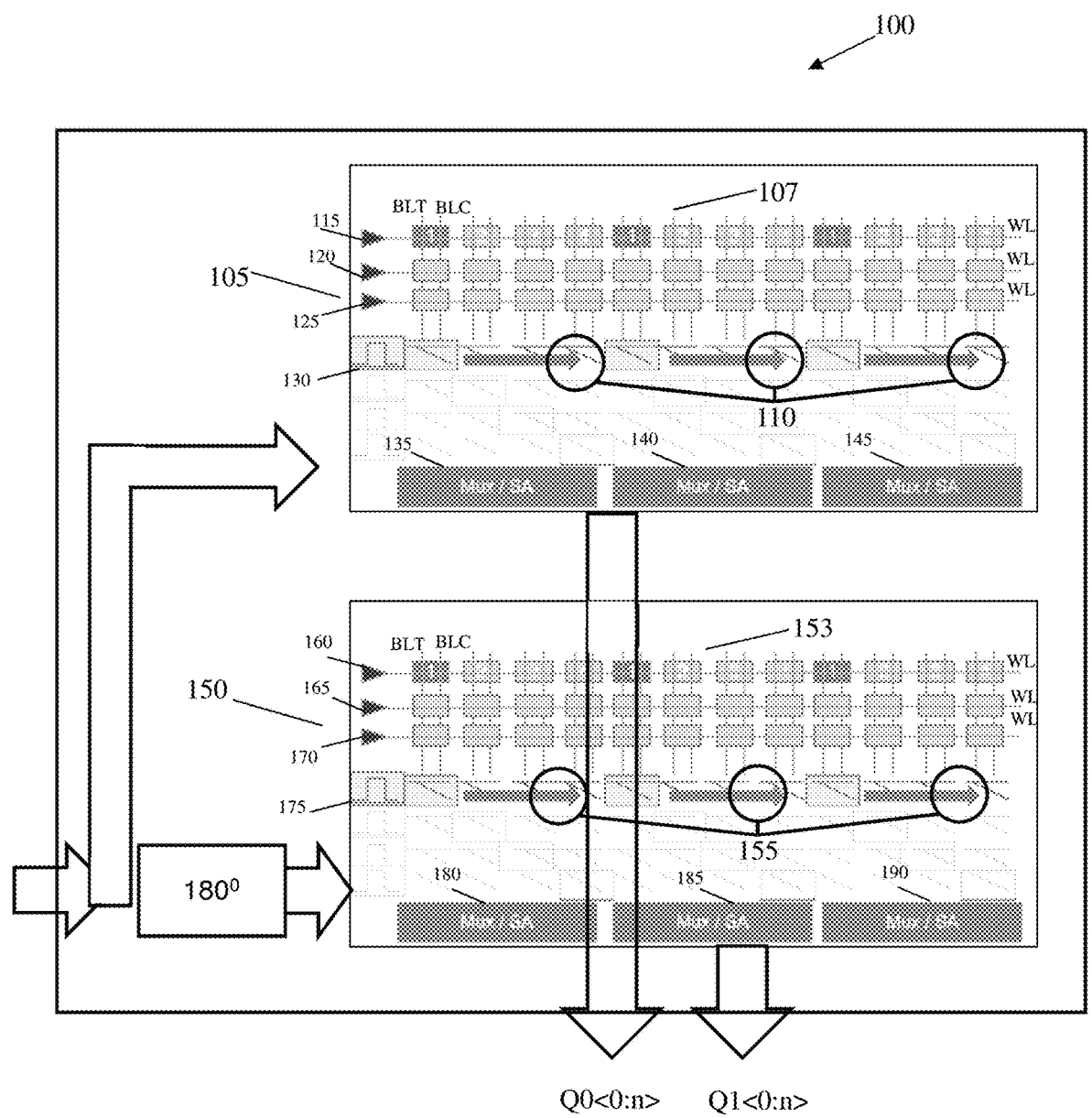
FIG. 1A shows memory banks operating with a phase-shifted sequential read in accordance with aspects of the present disclosure.

FIG. 1A shows memory banks 100 operating with a phase-shifted sequential read in accordance with aspects of the present disclosure. In the memory banks 100 of FIG. 1A, phase shifted boost arrays address a sense amplifier restore bubble using interleaved banks. For example, in FIG. 1A, a first system 105 for a multiplexer static random access memory read operation includes an array of columns 107. The array 107 includes a first column (i.e., represented as "1"), a second column (i.e., represented as "2"), a third column (i.e., represented as "3"), and a fourth column (i.e., represented as "4"). Further, the first system 105 repeats the first column 1, the second column 2, the third column 3, and the fourth column 4 for two more sets. Each of the first column 1, the second column 2, the third column 3, and the fourth column 4 receives a word line WL and true bit lines BLT and complement bit lines BLC. Further, the first system 105 shows a bit line BL restore hiding modification 110 for the present disclosure which allows for ping ponging between memory banks to increase the bandwidth on a global data line.

The first system 105 also includes a read controller 130, a first sense amplifier/multiplexer circuit 135, a second sense amplifier/multiplexer circuit 140, a third sense amplifier/multiplexer circuit 145, a first wordline driver 115, a second wordline driver 120, and a third wordline driver 125 corresponding to three adjacent word lines in the memory array. The first sense amplifier/multiplexer circuit 135 is shared by the first column 1, the second column 2, the third column 3, and the fourth column 4 in a basic decode 4 architecture. Similarly, the second sense amplifier/multiplexer circuit 140 is shared by the next consecutive four columns. One skilled in the art would recognize that the four bit line true and complement pairs 1, 2, 3, 4 would connect to data lines true and complement that feed into a shared sense amplifier/multiplexer circuit (i.e., one of the first sense amplifier/multiplexer circuit 135, the second sense amplifier/multiplexer circuit 140, and the third sense amplifier/multiplexer circuit 145) and output a single data output from the data out bus Q0<0:n>.

In the operation of FIG. 1A, the word line WL for the first system 105 is activated once, and then the multiplexer inputs from the read controller 130 are shifted to read and sense without needing to restore the bit lines BLs (BLT and BLC). For example, the word line WL is activated and the signal is developed on all the four pairs of true and complement bit lines corresponding with columns 1, 2, 3, and 4. The multiplexer input is configured to read the first column 1.

Reading a column comprises activating the multiplexer/bitswitch (i.e., the first sense amplifier/multiplexer circuit 135) to connect a desired column to the sense amplifier data lines DLT and DLC, setting the first sense amplifier/multiplexer circuit 135, latching the read data RDT0, RDT1, and restoring the sense amplifier data lines DLT and DLC. After the first read on column 1 is completed, a second read is performed for the second column 2. The sense amplifier of the sense amplifier/multiplexer circuit 135 is reset and the multiplexer of the first sense amplifier/multiplexer circuit 135 is shifted to the adjacent bit line pair BLT, BLC corresponding to the third column 3. The sense and read operation is performed for the third column 3 and the sense amplifier of the first sense amplifier/multiplexer circuit 135 is reset. The reading and sense operation for the column 4 is performed in parallel to reading and sense operation of column 3. This is possible due to the second sense structure 635 comprising the skewed inverter and latch. The bitlines are restored immediately after the column 3 is read, as opposed to being restored after column 4 in a conventional architecture. This enables the bitline precharge time to be hidden when moving from one burst read operation to the other burst read operation.

FIG. 1A also shows a second system 150 for a multiplexer static random access memory read operation which includes an array of columns 153. The array 153 is similar in structure and operation to the array 107. In particular, the array 153 includes the first column 1, the second column 2, the third column 3, the fourth column 4, a first sense amplifier/multiplexer circuit 180, a second sense amplifier/multiplexer circuit 185, a third sense amplifier/multiplexer circuit 190, a first wordline driver 160, a second wordline driver 165, and a third wordline driver 170, and a single data output Q1<0:n>. Further, each of the columns 1, 2, 3, and 4 receive a word line WL and bit lines BLT and BLC. The second system 150 is clocked to be offset from the first system 105 by 180 degrees. In this way, read mode bandwidth is increased by not only providing a burst architecture, but also providing two banks that are clocked offset by 180 degrees to approximately double the bandwidth. Further, the second system 150 shows a bit line BL restore hiding modification 155 for the present disclosure which allows for ping ponging between memory banks to increase the bandwidth on a global data line.

In embodiments, the first system 105 and the second system 150 includes a read controller 130, 175 configured to receive a burst enable signal and a word line pulse signal, identify consecutive read operations from storage cells accessed via a word line WL, and precharge bit lines (i.e., BLT, BLC) once during consecutive, sequential reads, and hold the word line WL active through N−1 of the consecutive read operations. N is an integer number of the consecutive read operations. The read controller 130, 175 is part of a SRAM which comprises two sensing paths for the array of the storage cells. Further, the structure includes an array of the storage cells of the first system 105 and the second system 150 being arranged as rows corresponding to word lines and columns corresponding to bit lines.

In embodiments, the holding of the word line WL active through N−1 of the consecutive read operations is enabled by an alternative read path that senses data using a tri-buffer structure 740 and a latch 635 in parallel with the (N−1)th column read. In embodiments, the precharging of the bit lines once during consecutive, sequential reads and holding the word line active through N−1 of the consecutive reads occurs based on the burst enable signal and the word line pulse signal indicating that the SRAM is operating in a sequential read mode. The sequential read mode hides a bit line restore time and allows an early bit line restore and early word line activation of a next word. The early bit line restore is performed by precharging a bit line immediately after a (N−1)th column read.

Further, the memory banks 100 have an early bit line BL restore 110, 155 and word line activation WL to address the burst-to-burst bubble. Therefore, when using the first system 105 and the second system 150, which is offset from the first system 105 by 180 degrees, a read mode bandwidth is increased by providing a burst architecture and two banks that are clocked offset by 180 degrees to approximately double the bandwidth (while restoring the data lines of first system 105, data from the second system 150 is output from the memory). In FIG. 1A, the write mode is unaffected because the write mode runs much slower than the read operations. Further, power savings occur based on the burst architecture.

Figure 1B:
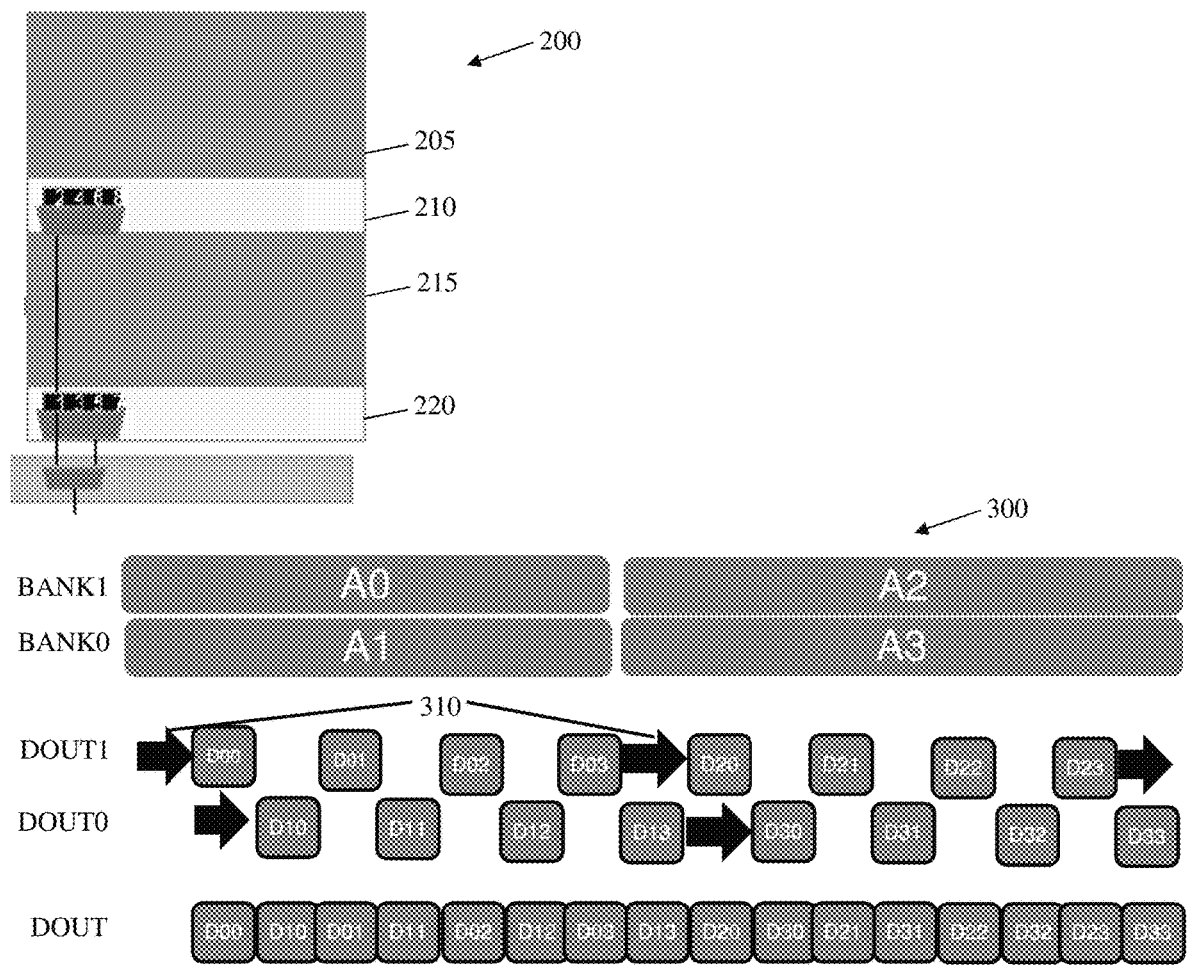
FIG. 1B shows an addressing scheme of memory banks operating with the phase-shifted sequential read in accordance with aspects of the present disclosure.

FIG. 1B shows an addressing scheme 300 of memory banks operating with the phase-shifted sequential read in accordance with aspects of the present disclosure. In FIG. 1B, a high density memory structure 200 includes a BANK1 205, a first sense amplifier 210, a BANK0 215, and a second sense amplifier 220. In the BANK0 215 and the BANK1 205, the cells/bit line BL and the cells/word line WL will be maximized. Further, in this design, the sense amplifiers 210, 220 can be maximized using a multiplexer 4 scheme. Each of the BANK0 215 and the BANK1 205 can run at ⅛th the frequency, thereby allowing lower array voltages. The ping ponging between memory banks allows higher bandwidth on the global data line by filling the data line restore bubble (stall) with data from a different memory bank.

In FIG. 1B, staggering addresses allow for the bit line BL signal development on the memory bank that is next on the read cycle operation. Each bank can run at 1/8th the frequency, which allows for lower array voltages. To alleviate the issue of global data line performance, ping ponging between memory banks allows for some higher bandwidth on the global data line at the cost of cycle time. In other words, the present disclosure develops enough signal on the bit lines BLs in one fast cycle. For example, the BANK1 may receive addresses A0 and A2 and the BANK0 may receive addresses A1 and A3. Address A0 represents a common word line within a memory bank with signal being developed on N columns in parallel. Hence, the N columns can have parallel burst operations. In particular, as address A0 is received at BANK1 and address A1 is received at BANK0, a row x in BANK1 and row y in BANK0 will develop signal on four columns (bitline pairs within each banks) which are read sequentially in a burst fashion. The output signal D00 is data from BANK1, the row x, column 1. The output signal D01 is data from BANK1, row x, column 2. The output signal D02 is data from BANK1, row x, column 3. The output signal D03 is data from BANK1, row x, column 4. Further, the output signal D10 is data from BANK0, row y, column 1. The output signal D11 is data from BANK0, row y, column 2. The output signal D12 is data from BANK0, row y, column 3. The output signal D13 is data from BANK0, row y, column 4. Therefore, the output signal DOUT1 of BANK1 may be output as D00 and then the output signal DOUT0 of BANK0 may be output as D10. Therefore, in this scenario, the overall output signal DOUT is D00 followed by D10. The process is repeated several times, in which the output DOUT1 of BANK1 is alternatively output with the output DOUT0 of BANK0 (e.g., the addressing scheme 300). Further, a bit line BL signal development 310 can occur once during the four consecutive read cycles. Further, the alternative sequential outputs from DOUT1 and DOUT0 are referred to as ping ponging between memory banks BANK1 and BANK0.

Figures 2A, 2B:
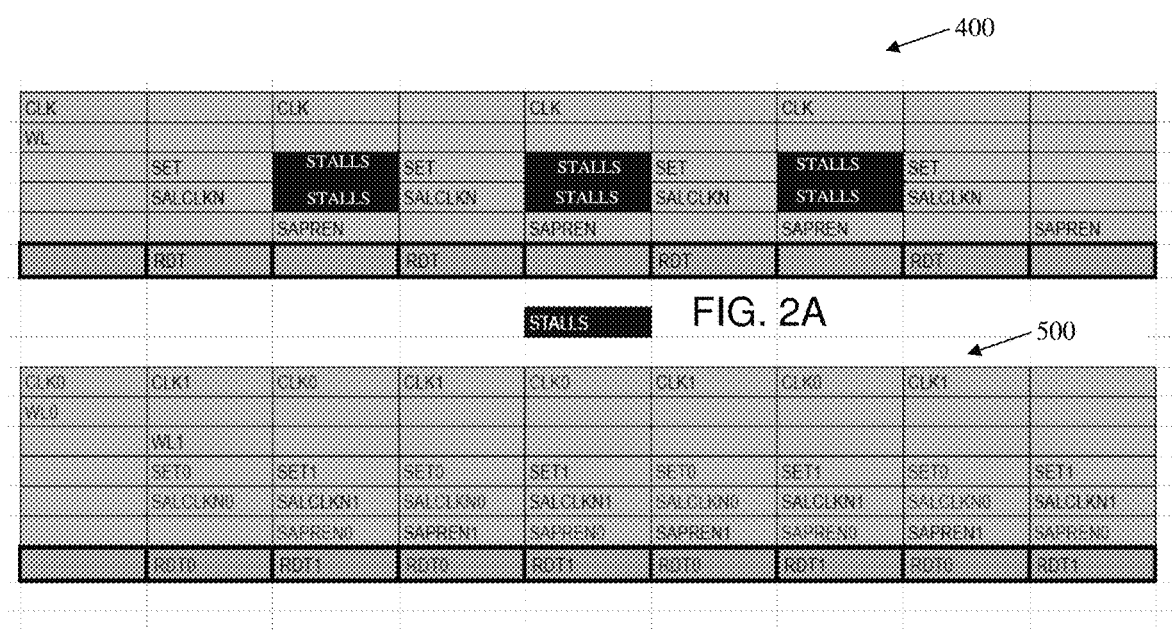
FIG. 2A shows a burst mode operation in which column 1 is read after a sense amplifier restore of column 0 is complete in accordance with aspects of the present disclosure.
FIG. 2B shows an interleaving of the burst mode operation in which bank 1 read operations can be performed during stalls, while bank 0 is being read in accordance with aspects of the present disclosure.

FIG. 2A shows a conventional burst mode operation 400 in which column 1 is read after a sense amplifier restore of column 0 is complete in accordance with aspects of the present disclosure. In the situation of FIG. 2A, there are stalls (depicted in white text) when the column 0 is being restored.

On the other hand, FIG. 2B shows an interleaving of the burst mode operation 500 in which bank 1 read operations can be performed during stalls, while bank 0 is being read in accordance with aspects of the present disclosure. More specifically, FIG. 2B shows the interleaving of operations such that BANK1 read operations (i.e., SET0, CLK0, WL0, SAPREN0, and SACLKN0) can be performed in the stalls, while the BANK0 read operations (i.e., SET1, CLK1, WL1, SAPREN1, and SALCKLN1) are also being performed. Further, in comparison to FIG. 2A in which stall operations require column 0 to be restored, BANK1 read operations in FIG. 2B can be performed in the stalls while BANK0 is being read.

As an example, the SET1 and SALCKN1 operations are performed in the interleaved burst mode operation 500 where stall operations would normally occur in FIG. 2A. Further, a SAPREN1 operation can be performed in the interleaved burst mode operation 500 where another stall operation would normally occur in FIG. 2A. In other words, FIG. 2B shows that the stall operations are overlapped by reading the other bank in parallel. These operations can be implemented in a static random access memory with phase shifted burst arrays with a bit line restore hiding modification.

In conventional circuitry, a bit line precharge forms a limitation on a cycle time when going from one set of column bursts (i.e., base decode4) to the other column set. Therefore, in the conventional circuitry, the next column read of the other column set cannot start before the bit lines are precharged. In contrast, the structures 600, 700, and 740 of FIGS. 3-4 allow the third column and the fourth column reads to be performed in parallel through two different read paths. In particular, a 2:1 multiplexer 640 (shown in FIG. 3) allows for muxing between the third and fourth read operations such that after the third read operation is performed, the bit lines are precharged. Therefore, precharging the bit lines can occur before the fourth read operation is completed. Further, the structures 600, 700, and 740 of FIGS. 3-4 ensure enough signal development time for the first slow read operation of the next set of columns. Thus, the structures 600, 700 allow hiding of the bit line precharge duration to allow the word line to reset earlier with minimal increased area overhead (i.e., needs additional latch and multiplexer).

Moreover, a burst to burst challenge (i.e., going from one set of 4 column reads to another set of 4 column reads) can cause a cycle time limitation due to a bit line BL restore and a signal development of a next word line WL activation. In this scenario, the bit lines BLs are pre-charged before the next read operation. Precharging the bit lines BLs can be an issue because the time to precharge the bit lines BLs all the way from ground to VDD will reduce the minimum cycle time for higher cells/bit lines (consumes a lot of time to precharge the bitlines due to the large capacitance). Further, the burst to burst challenge also poses a challenge for the signal development of the first read operation of the next four columns. In order to mitigate the burst to burst challenge, the present disclosure uses the structure 600 of the sense amplifier bypass scheme in FIG. 3 to pull the word line WL earlier on the next set of subsequent burst read operations after the first burst read operation. In other words, the structure 600 of FIG. 3 precharges the bit lines BLs before the fourth read operation to ensure there is enough signal development time for the first slow read of the next four set of columns.

Figure 3:
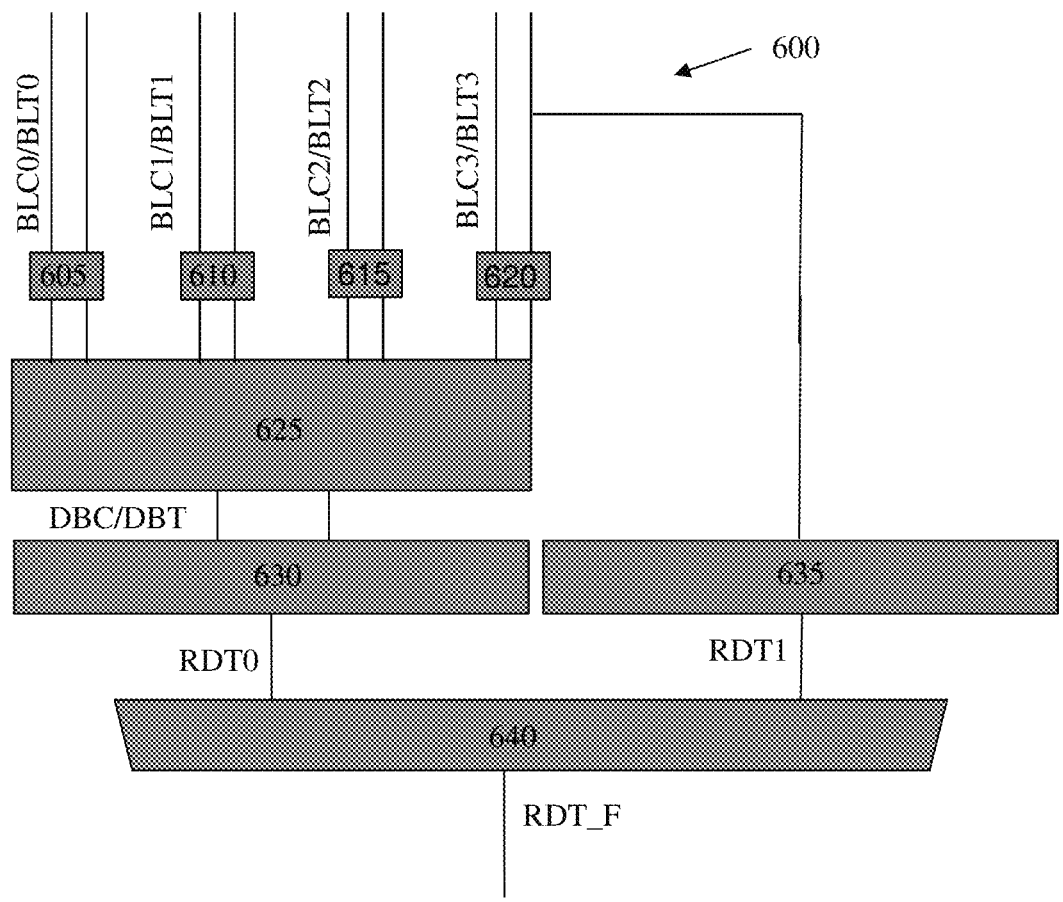
FIG. 3 shows a structure for a sense amplifier bypass scheme in accordance with aspects of the present disclosure.

More specifically, FIG. 3 shows a structure for a sense amplifier bypass scheme in accordance with aspects of the present disclosure. The structure 600 includes a first bitswitch 605, a second bitswitch 610, a third bitswitch 615, a fourth bitswitch 620, a sense amplifier 625, a first latch 630, a second latch 635, and the 2:1 multiplexer 640. The first bitswitch 605 receives a first true bit line BLT0 and a first complement bit line BLC0 and outputs to the sense amplifier 625. The second bitswitch 610 receives a second true bit line BLT1 and a second complement bit line BLC1 and outputs to the sense amplifier 630. The third bitswitch 615 receives a third true bit line BLT2 and a third complement bit line BLC2 and outputs to the sense amplifier 625. The fourth bitswitch 620 receives a fourth true bit line BLT3 and a fourth complement bit line BLC3. Accordingly, the sense amplifier 625 receives output signals from the first bitswitch 605, the second bitswitch 610, the third bitswitch 615, and the fourth bitswitch 620.

The sense amplifier 625 outputs true data bit line DBT and complement data bit line DBC to the first latch 630. Further, the second latch 635 receives the fourth true bit line BLT3 and outputs a second true read data RDT1 to the 2:1 multiplexer 640. The first latch 630 also outputs a first true read data RDT0 to the 2:1 multiplexer 640. The 2:1 multiplexer 640 outputs a final true read data RDT_F.

In embodiments, the 2:1 multiplexer 640 selects among the tri-buffer output signal RDT1 and the sense output signal RDT0 and outputs a read output RDT_F for a column structure including N columns.

Figure 4:
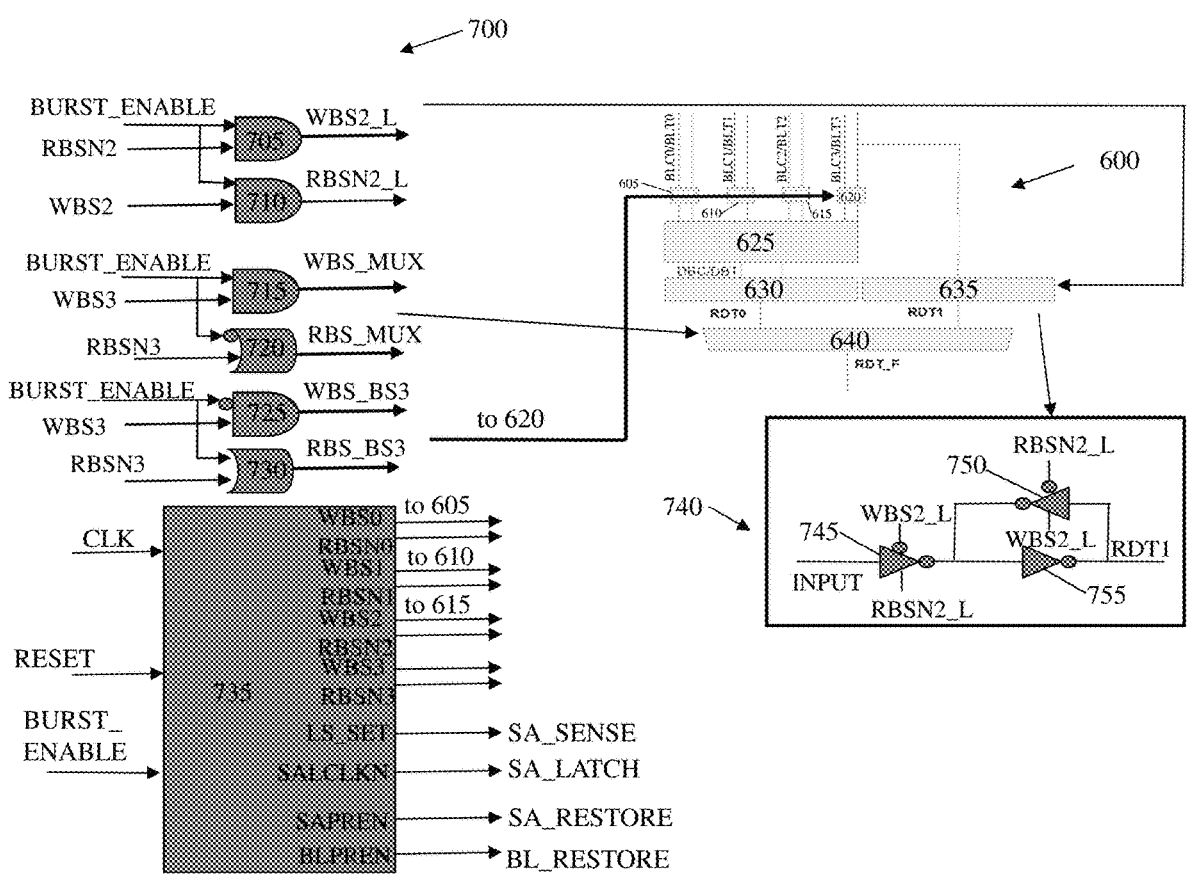
FIG. 4 shows a control block diagram for the sense amplifier bypass scheme in accordance with aspects of the present disclosure.

FIG. 4 shows a control block diagram for the sense amplifier bypass scheme in accordance with aspects of the present disclosure. The structure 700 includes AND gates 705, 710, 715, and 725, OR gates 720, 730, and control logic 735. Further, a tri-buffer structure 740 includes tri-buffers 745, 750 and an inverter 755. In addition, the structure 600 is shown above in FIG. 3 receives signals from the structure 700 and the tri-buffer structure 740.

In FIG. 4, the AND gate 705 receives a BURST_ENABLE signal and a WBS2 signal and outputs a WBS2_L signal and the AND gate 710 receives the BURST_ENABLE signal and a RBSN2 signal and outputs a RBSN2_L signal. The WBS2_L and RBSN2_L signals are then fed to the second latch 635. The AND gate 715 receives the BURST_ENABLE signal and a WBS3 signal and outputs a WBS_MUX signal and the OR gate 720 receives the inverted BURST_ENABLE signal and a RBSN3 signal and outputs a RBS_MUX signal. The WBS_MUX and RBS_MUX signals are then fed to the 2:1 multiplexer 640. The AND gate 725 receives the inverted BURST_ENABLE signal and a WBS3 signal and outputs a WBS_BS3 signal and the OR gate 730 receives the BURST_ENABLE signal and a RBSN3 signal and outputs the RBS_BS3 signal. The WBS_BS3 and RBS_BS3 signals are then fed into the fourth bitswitch 620.

The control logic 735 receives a clock CLK signal, a RESET signal, and the BURST_ENABLE signal. Further, the control logic 735 outputs the WBS0 and RBSN0 signals to the first bitswitch 605, the WBS1 and RBSN1 signals to the second bitswitch 610, and the WBS2 and RBSN2 signals to the third bitswitch 615. The RBSN3 and WBS3 signals are sent to the AND gate 725 and the OR gate 730. Further, the control logic 735 outputs the sense amplifier sense SA_SENSE signal, the sense amplifier latch SA_LATCH signal, the sense amplifier restore SA_RESTORE signal, and the bit line restore BL_RESTORE signal.

The tri-buffer structure 740 receives the RDT1 signal which is output from the second latch 635. Further, a second tri-buffer 750 receives the RDT1 signal, the RBSN2_L signal, the WBS2_L signal and outputs a signal to the input of an inverter 755. Further, the first tri-buffer 745 receives an input signal, the WBS2_L signal, the RBSN2_L signal and outputs the signal to the input of the inverter 755. The tri-buffer structure 740 is a skewed tri-buffer sensing structure which enables an early bit line restore and activation of a next word line in a cycle before a next cycle.

Figure 5:
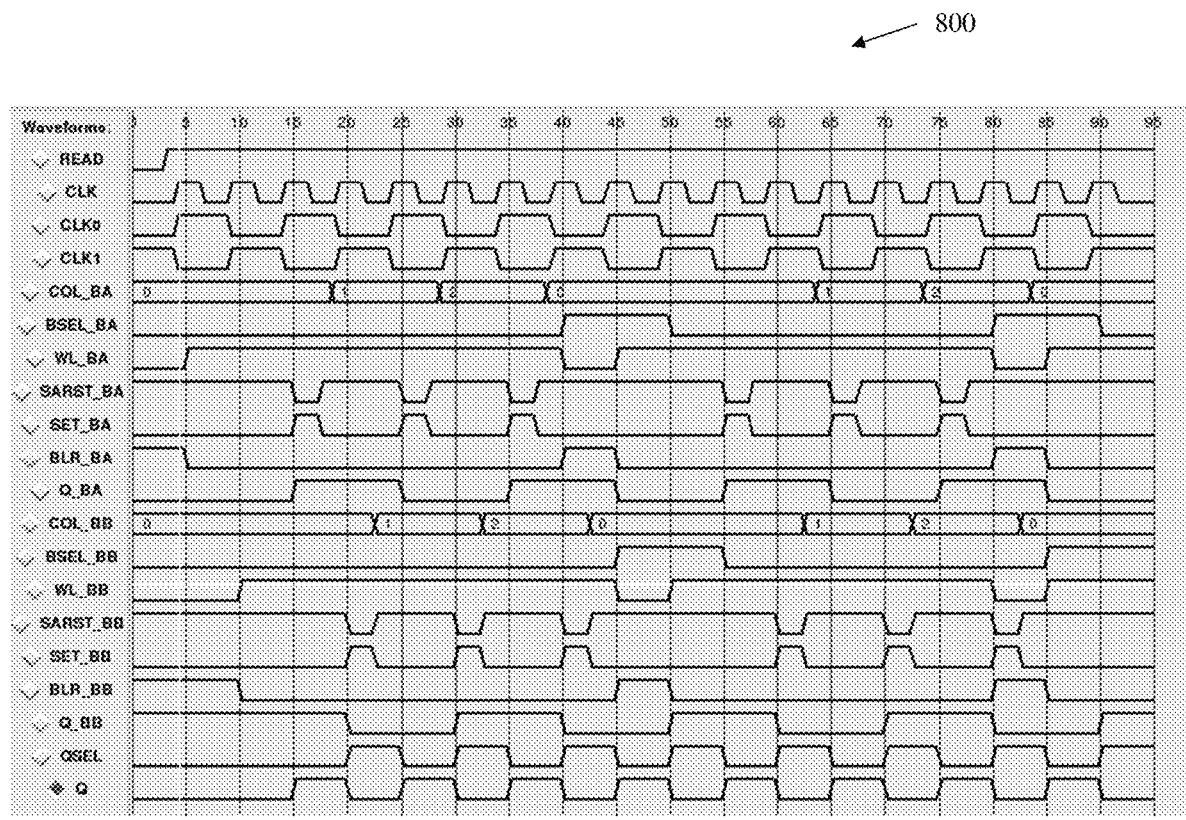
FIG. 5 shows a timing diagram of the phase-shifted sequential read in accordance with aspects of the present disclosure.

FIG. 5 shows a timing diagram of the phase-shifted sequential read in accordance with aspects of the present disclosure. In FIG. 5, the timing diagram 800 includes waveforms/signals on the y-axis and time (in nanoseconds) on the x-axis. As shown in FIG. 5, when combining the ping pong and burst architecture, a lowest cycle time can be achieved for a given voltage. Further, the ping pong and burst architecture has lower power in comparison to a conventional circuitry ping pong architecture using a given cycle time.

The timing diagram 800 includes the following signals: a READ control signal that goes to "1" to signify that a read is requested from memory; a CLK signal which is a free running clock that is supplied by a customer/tester for the memory; CLK0/CLK1 signals which are even and odd versions of the CLK signal shown in FIG. 6; _BA which refers to signals located within a first bank (i.e., BANKA or BANK0); _BB which refers to signals located within a second bank (i.e., BANKB or BANK1); COL is a column select signal which routes a true and complement bit line for data sensing; and a bitswitch select BSEL signal.

The timing diagram 800 also includes a word line WL which is the word line activation (row). The word line WL is held active for three of the four consecutive read operations. The timing diagram 800 further includes a sense amplifier restore SARST signal which is required between read operations to restore the true and complement data line signals within a sense amplifier and prepares data sensing on the next word. In addition, a sense amplifier set SET signal is used to set a full differential voltage level and transfer data out of the sense amplifier and onto local/global data lines. A bit line restore BLR signal is used no more than once during a group of consecutive reads to restore the bit lines to a known voltage. The timing diagram 800 also includes a local data out Q_signal from a bank being read that includes a pattern that assumes toggling data on each time period, and a final data out Q signal from the memory which is run at approximately 4 times a normal SRAM as data is coming in a burst fashion from two banks which are ping ponged (i.e., toggled back and forth). The final data out Q signal will capture data from Q_BA and Q_BB and deliver twice the bandwidth to the customer/tester. Lastly, the timing diagram 800 includes a select signal QSEL to select between the Q_BA and Q_BB to output the final data out Q signal.

In the timing diagram 800 of FIG. 5, a burst mode read operation with a ping pong between two banks is shown (i.e., the final data out Q will capture ping pong data between Q_BA and Q_BB in FIG. 5). A READ signal transitions to a "1" and a rising CLK edge kicks off the burst read between the two banks (i.e., BANK A and BANK B). A burst mode refers to a word line activating two or more reads (in this situation, MUX4 is used, so four columns will be activated) such that signal is developed on four pairs of true and complement bit line.

Also, in the timing diagram 800, true random access in the SRAM is exchanged for higher throughput or read bandwidth (i.e., there is a tradeoff) by sequentially reading column 0, column 1, column 2, and then with a domino style sense, column 3. The COL signal will sequentially count from 0 when reading column 0, to 1 when reading column 1, to 2 when reading column 2, and the BSEL signal transitions to "1", column 3 regardless of the COL signal value. Column 3 is sensed with a domino style sense (i.e., inverter directly connected to a bit line) instead of being sensed with a sense amplifier. Sensing column 3 with a domino style sense enables higher performance by allowing a bit line restore (i.e., BLR signal goes to "1") after reading column 2. For example, FIGS. 3 and 4 show that column 3 bit lines are fed into an inverter and then a latch that is transparent when the COL signal is 2 (i.e., loads data) and holds when the COL signal is not equal to 2 (i.e., holds data). In this scenario, the word line WL can be deactivated (e.g., the word line WL is activated when "1" and deactivated when "0") and the true and complement bit lines of the two more adjacent columns can be restored. For example, when reading columns 0, 1, and 2, a sense amplifier can perform a restore operation to clear the last read operation and put the sense amplifier in a known state that is suitable for sensing. The sense amplifier restore signal (i.e., SARST signal) is low when the bit switch column decoder is open to avoid corrupting the data (i.e., corrupt the true and complement bit line). Therefore, the SARST signal must be "0" when performing a read operation. On a fourth column, i.e., to read COL=3, a domino style sensing is used to connect a bit line directly to an inverter for sensing operations. This direct connection between the bit line and the inverter allows for the bit line restore to start one cycle sooner (in comparison to conventional burst operations).

Figure 6:
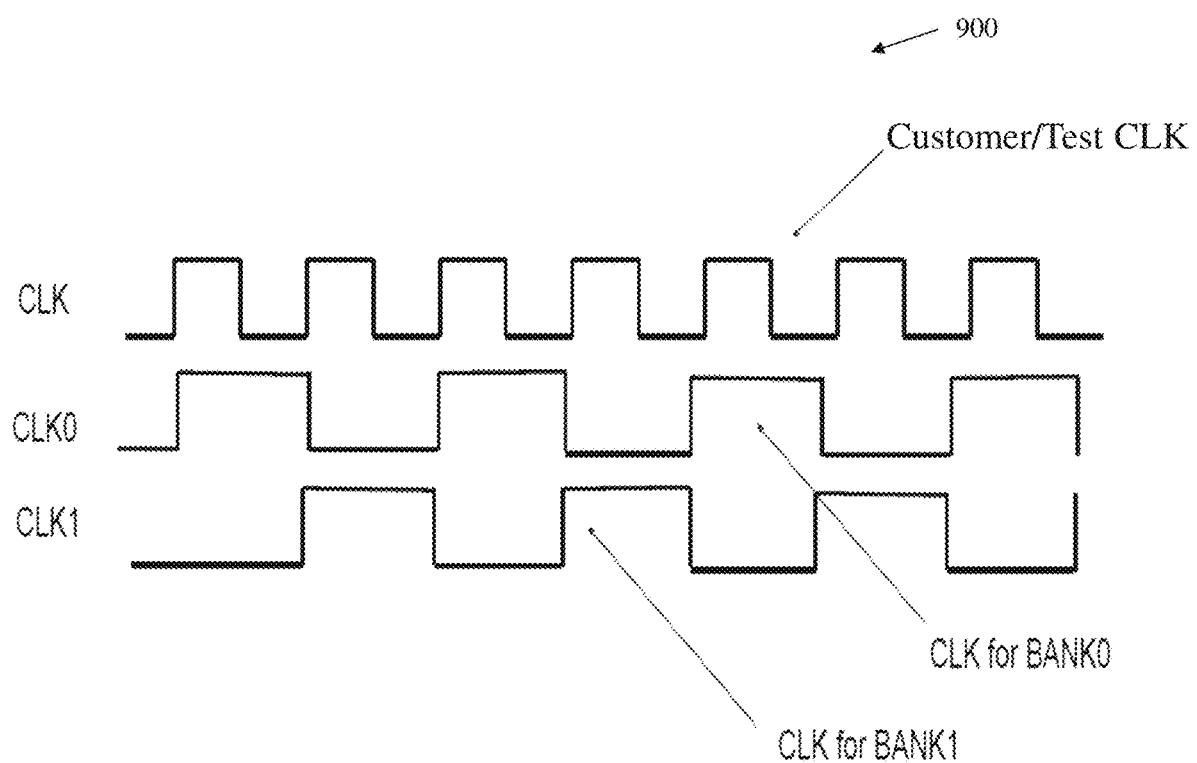
FIG. 6 shows a clocking scheme for the memory banks in accordance with aspects of the present disclosure.

FIG. 6 shows a clocking scheme for the memory banks in accordance with aspects of the present disclosure. In FIG. 6, the clocking scheme 900 shows a clock CLK0 for the first memory bank (i.e., BANK0 or BANKA) and a clock CLK1 for the second memory bank (i.e., BANK1 or BANKB). Therefore, CLK0 and CLK1 are even and odd versions of the customer/test CLK. Further, the customer/test CLK signal runs approximately 2× the CLK1 and CLK0 clock signals.

Figure 7:
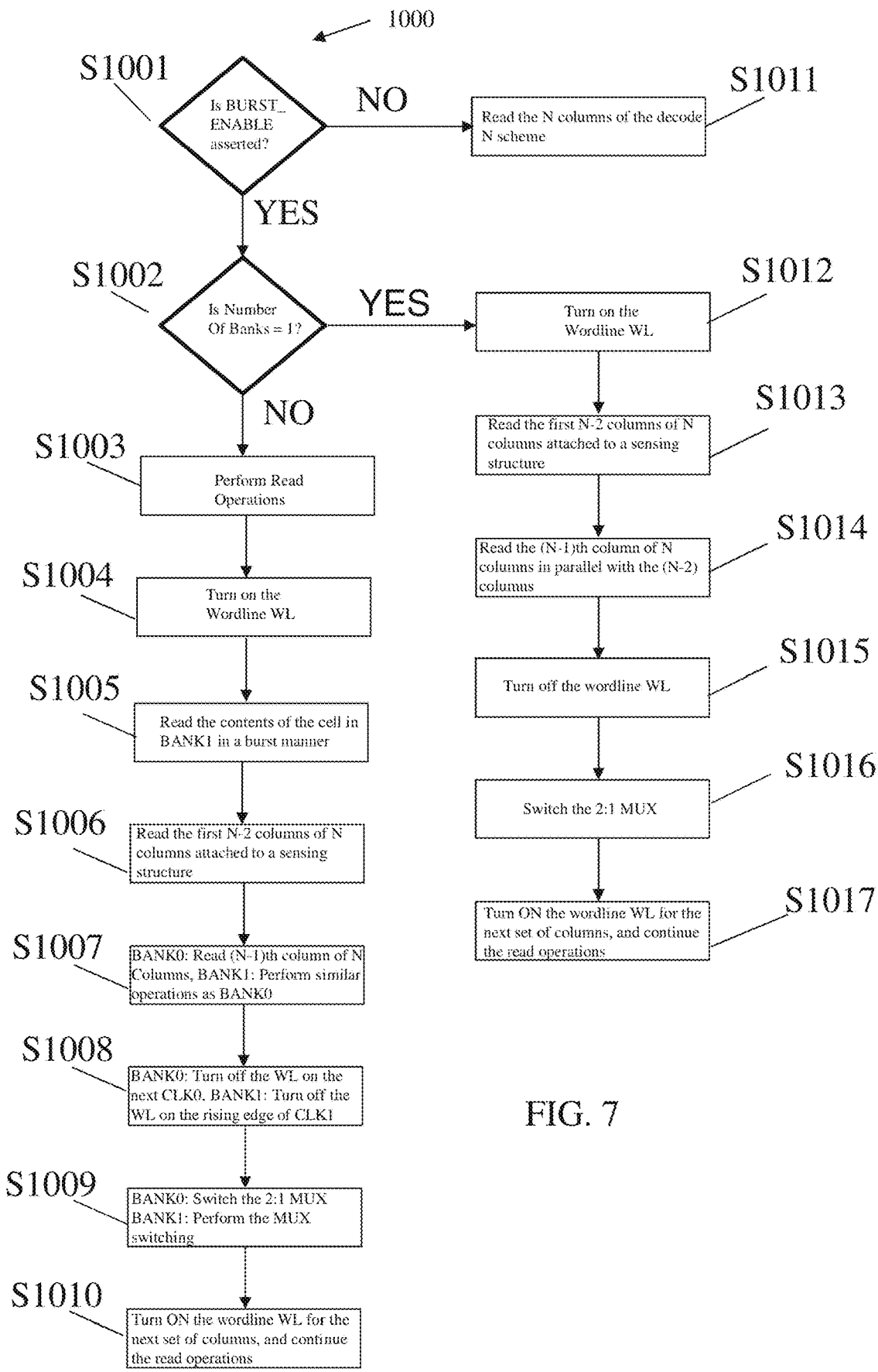
FIG. 7 shows a flowchart of the phase-shifted sequential read in accordance with aspects of the present disclosure.

FIG. 7 shows a flowchart of the phase-shifted sequential read operation in accordance with aspects of the present disclosure. In a step S1001 of the flowchart 1000, a determination is made as to whether the BURST_ENABLE signal is asserted. If the BURST_ENABLE signal is not asserted (i.e., NO), in step S1011, the N columns of the decode N scheme are read, and the sequence of operations include turning on the word line WL for each column, sensing the bit lines, and restoring the bit lines for every single column read. If the BURST_ENABLE signal is asserted (i.e., YES), in step S1002, a determination is made as to whether the number of memory banks is 1.

If the number of memory banks is 1 (i.e., YES), in step S1012, the word line WL is turned on. In step S1013, the first N−2 columns of N columns attached to a sensing structure are read, without precharging the bit lines. In step S1014, the (N−1)th column of N columns in parallel with the (N−2)th column is read through a tri-buffer and a latch. In step S1015, the word line WL is turned off and the bit lines BLs are restored. In step S1016, the multiplexer (e.g., 2:1 MUX) is switched such that the data stored in LATCH2 (i.e., latch in tri-buffer path) is passed. In step S1017, at a same CLK cycle, the word line WL (address) is turned ON for the next set of columns, and the read operation is continued.

If the number of memory banks is not 1 (i.e., NO), in step S1003, the read operations are performed for two/more than two banks in a time-interleaved burst fashion. The sequence of events in BANK0 (or BANKA) are toggled off of CLK0 and the sequence of events in BANK1 (or BANKB) are toggled off of CLK1. In step S1004, the word line WL corresponding to BANK0 (or BANKA) is turned on. The contents of the cell are read in a burst manner while the word line WL in BANK0 (or BANKA) is kept on. In step S1005, on the rising edge of CLK1, the word line WL for the BANK1 (or BANKB) is turned on and the contents of the cell in BANK1 (or BANKB) are read in a burst manner while the word line in BANK1 (or BANKB) is kept on. In step S1006, the first N−2 columns of N columns attached to a sensing structure are read, without precharging the bit lines in BANK0 (or BANKA) and BANK1 (or BANKB).

In step S1007, in BANK0 (or BANKA), the (N−1)th column of N columns are read in parallel with the (N−2)th column through a tri-buffer and a latch. Further, in BANK1 (or BANKB), similar operations are performed as BANK0 (or BANKA) on the rising edge of the phase shifted clock. In step S1008, in BANK0 (or BANKA), the word line WL is turned off on the next clock CLK0 and the bit lines are precharged. In BANK1 (or BANKB), the word line WL is turned off on the corresponding rising edge of CLK1 and the bit lines are precharged. In step S1009, in BANK0 (or BANKA), the multiplexer (i.e., the 2:1 MUX) is switched such that the data stored in LATCH2 (i.e., latch in tri-buffer path) is passed. At a same time, the word line WL (address) is turned on for the next set of columns and the read operations is continued. In BANK1 (or BANKB), the multiplexer (i.e., the 2:1 MUX) performs switching on the phase shifted version of the block. In step 1010, at the same clock cycle CLK0 in BANK0 (or BANKA) and CLK1 in BANK1 (or BANKB), the word line WL (address) is turned on for the next set of columns, and continue to perform the read operations for the next set of columns.

In embodiments, a method may include sensing sequential read operations of N−1 consecutive read operations through a sense amplifier 625 and sensing an N read operation through a skewed tribuffer circuit 740 to enable early bit line restore and activation of a next word line in a cycle earlier than a next cycle. The sequential read operations of N−1 consecutive read operations are performed by reading at least two banks of memory in a sequential interleaved read mode operation.

In embodiments, the sequential interleaved read mode operation includes performing a read operation in a first bank of the at least two banks of memory while performing a sense amplifier restore operation in a second bank of the at least two banks of memory. The first bank has a clock which is phase shifted from a clock of the second bank, and the clock of the first bank and the clock of the second bank run at approximately half an external clock frequency. The method may further include preventing a read operation to one of the first bank and the second bank in back to back clock cycles.

The circuit and the method for using a phase shifted burst mode in a static random access memory to save power and improve performance associated with address switching and decoding of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for using a phase shifted burst mode in a static random access memory to save power and improve performance associated with address switching and decoding of the present disclosure has been adopted from integrated circuit (IC) technology. For example, the structures are built on wafers and are realized in films of material patterned by photolithographic processes on the top of a wafer. In particular, the fabrication of the circuit and the method for using a phase shifted burst mode in a static random access memory to save power and improve performance associated with address switching and decoding uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory structure comprising:
    an array of storage cells comprising bit lines and N storage cells, wherein the N storage cells are accessible via a first word line, and where N is an integer greater than two;
    at least one of
        a single sense amplifier configured to sense bits from N−1 storage cells of the N storage cells during N−1 consecutive read operations, or
        a first latch configured to latch the bits from the N−1 storage cells during the N−1 consecutive read operations; and
    a read controller configured to, during the N−1 consecutive read operations, i) precharge the bit lines once, ii) access at least N−1 of the N storage cells via the first word line, and, iii) awhile holding the first word line active, signal at least one of the single sense amplifier or the first latch to acquire the bits of the N−1 storage cells.

2. The structure of claim 1, wherein the storage cells of the array of storage cells are arranged in rows and columns.

3. The structure of claim 2, wherein:
    the array of storage cells includes a plurality of word lines corresponding to the rows of the array of storage cells, wherein the plurality of word lines comprises the first word line; and
    the bit lines correspond to the columns of the array of storage cells.

4. The structure of claim 1, wherein:
    the holding of the first word line active through the N−1 consecutive read operations is enabled by an alternative read path; and
    the alternative read path senses data from a $N^{th}$ storage cell of the N storage cells using a tri-buffer and a second latch while a $N-1^{th}$ column of the array of storage cells including the N storage cells is read using the first latch.

5. The structure of claim 1, wherein the read controller is part of a static random access memory.

6. The structure of claim 1, wherein;
    the precharging of the bit lines once and the holding of the first word line active through the N−1 consecutive read operations is triggered based on a burst enable signal and a ward line pulse signal; and
    the burst enable signal and the word line pulse signal are indicative of a static random access memory operating in a sequential read mode.

7. The structure of claim 6, wherein the sequential read mode includes, while selecting a bit received from a $N^{th}$ storage cell of the N storage cell, restoring the bit lines and activating a next word line.

8. A method of reading from a memory structure, the method comprising:
    performing N−1 consecutive read operations including sensing bits from N storage cells along a first word line of the memory structure, where N is an integer greater than two, and wherein, during the N−1 consecutive read operations, the bit of the $N-1^{th}$ storage cell and the bit of the $N^{th}$ storage cell are concurrently read from the $N-1^{th}$ storage cell and the $N^{th}$ storage cell to enable early restoring of bit line of the memory structure and early activating of a next word line of the memory structure; and
    concurrently
        receiving the bit of the $N^{th}$ storage cell read by activation of the first word line and read during the $N-1^{th}$ consecutive read operation, and
        restoring the bit lines of the memory structure and activating the next word line.

9. The method of claim 8, wherein the N−1 consecutive read operations are performed by reading at least two banks of memory in a sequential interleaved read mode operation.

10. The method of claim 9, wherein the sequential interleaved read mode operation comprises performing a read operation in a first bank of the at least two banks of memory while performing a sense amplifier restore operation in a second bank of the at least two banks of memory.

11. The method of claim 10, wherein a dock of the first bank is phase shifted from a dock of the second bank.

12. The method of claim 11, wherein the dock of the first bank and the dock of the second bank run at approximately half an external dock frequency.

13. The method of claim 12, further comprising preventing a read operation of one of the first bank and the second bank in back to back clock cycles.

14. The structure of claim 1, further comprising:
    the first latch configured to latch the bits from the N−1 storage cells of the N storage cells during the N−1 consecutive read operations; and
    a second latch configured to latch a bit from the $N^{th}$ storage cell of the N storage cells during the $N-1^{th}$ consecutive read operation.

15. The structure of claim 14, wherein the second latch is configured to latch the bit from the $N^{th}$ storage cell while the first latch latches the bit from the $N-1^{th}$ storage cell of the N storage cells.

16. The structure of claim 15, wherein:
    the first latch latches the bits of the N−1 storage cells consecutively; and the second latch latches the bit of the $N^{th}$ storage cell in parallel with the latching of the bit of the $N-1^{th}$ storage cell by the first latch.

17. The structure of claim 16, further comprising the single sense amplifier and the first latch, wherein the single sense amplifier comprises:

a plurality of pairs of inputs connected to respective pairs of the bit lines; and a single pair of outputs providing the bits from the N-1 storage cells to the first latch.

18. The structure of claim 14, further comprising a multiplexer configured to receive outputs of the first latch and the second latch, wherein the read controller is configured to control the multiplexer to select the output of the second latch while restoring the bit lines, restoring the single sense amplifier, and activating a second word line.

19. The structure of claim 18, wherein:

the read controller is configured to when selecting the first word line, select a word line of a first memory bank, and when selecting the second word line, select a word line of a second memory bank;

the second memory bank includes a different array of storage cells and different word lines than the first memory bank; and dock timing of the second memory bank is phase shifted from dock timing of the first memory bank.

20. The method of claim 8, further comprising:

concurrently latching the bit of the $N-1^{th}$ storage cell into a first latch and latching the bit of the $N^{th}$ storage cell into a second latch;

subsequent to latching the bit of the $N-1^{th}$ storage cell and the bit of the $N^{th}$ storage cell, receiving the bit of the $N-1^{th}$ storage cell at a multiplexer, and subsequent to the bit of the $N^{th}$ storage cell being received at a multiplexer, concurrently receiving the bit of the Nth storage cell at the multiplexer and restoring the bit lines of the memory structure and activating the next wordline.

* * * * *